United States Patent
Song et al.

(10) Patent No.: US 7,675,305 B2
(45) Date of Patent: Mar. 9, 2010

(54) VERTICAL-TYPE ELECTRIC CONTACTOR AND MANUFACTURE METHOD THEREOF

(75) Inventors: Byoung-hak Song, Seoul (KR); Moon-hyuk Jeong, Seoul (KR)

(73) Assignee: Phicom Corporation, Seoul (KR)

( * ) Notice: Subject to any disclaimer, the term of this patent is extended or adjusted under 35 U.S.C. 154(b) by 143 days.

(21) Appl. No.: 11/661,628

(22) PCT Filed: Oct. 25, 2005

(86) PCT No.: PCT/KR2005/003549

§ 371 (c)(1), (2), (4) Date: Feb. 28, 2007

(87) PCT Pub. No.: WO2006/046821

PCT Pub. Date: May 4, 2006

(65) Prior Publication Data

US 2008/0204060 A1  Aug. 28, 2008

(30) Foreign Application Priority Data

Oct. 26, 2004  (KR) ........................ 10-2004-0085878

(51) Int. Cl.
*G01R 31/02* (2006.01)
*H01R 4/58* (2006.01)
(52) U.S. Cl. .................... 324/757; 324/761; 439/70
(58) Field of Classification Search ............ 324/754, 324/757, 761; 439/70
See application file for complete search history.

(56) References Cited

U.S. PATENT DOCUMENTS

| 4,307,928 | A  | * | 12/1981 | Petlock, Jr. ............... 439/824 |
| 5,135,403 | A  | * | 8/1992  | Rinaldi .................... 439/82  |
| 5,667,410 | A  | * | 9/1997  | Johnston .................. 439/700 |
| 5,730,606 | A  | * | 3/1998  | Sinclair ................... 439/70  |
| 5,900,738 | A  | * | 5/1999  | Khandros et al. ........... 324/761 |
| 6,784,680 | B2 | * | 8/2004  | Haga et al. ................ 324/761 |
| 7,090,503 | B2 | * | 8/2006  | Dittmann .................. 439/66  |
| 2001/0026166 | A1 |   | 10/2001 | Khoury et al. |
| 2002/0153913 | A1 | * | 10/2002 | Okubo et al. .............. 324/761 |

FOREIGN PATENT DOCUMENTS

KR    2004-40079 A    5/2004

OTHER PUBLICATIONS

International Search Report for PCT/KR2005/003549 dated Jan. 12, 2006.

* cited by examiner

*Primary Examiner*—Ha Tran T Nguyen
*Assistant Examiner*—Karen M Kusumakar
(74) *Attorney, Agent, or Firm*—Jenkins, Wilson, Taylor & Hunt, P.A.

(57) ABSTRACT

A vertical-type electric contactor connected to a bump of an electric contactor is provided. The vertical-type electric contactor includes a support beam, vertically bonded with the bump, in which at least two elastic parts are spaced apart from each other; a fixed part disposed at the bottom end of the support beam for fixing the support beam; and a tip part disposed at the bottom end of the fixed part, the tip part and the fixed part being a single body. According to the vertical-type electric contactor, a reaction force generated at a tip part is effectively distributed to test electric devices without damage of the vertical-type electric contactor.

11 Claims, 12 Drawing Sheets

FIG.1

PRIOR ART

FIG.2

PRIOR ART

VERTICAL-TYPE ELECTRIC CONTACTOR AND MANUFACTURE METHOD THEREOF

TECHNICAL FIELD

The present invention relates to an apparatus for testing electronic devices. More specifically, the invention is directed to a vertical-type electric contactor of a probe card and a method of manufacturing the same.

BACKGROUND ART

In recent years, capacity of semiconductor devices is advancing to 255 MDRAM and 1 GDRAM. With the advance in capacity of semiconductor devices, package technologies adopt C4 (controlled collapse chip connection) rather than SOC (system on chip). Hence, WaferLevel package technologies are widely used to package semiconductor devices.

Such WaferLevel package technologies require development of vertical-type electric contactor of a probe card for testing ball-shaped pads arranged in a matrix.

Figure 1:
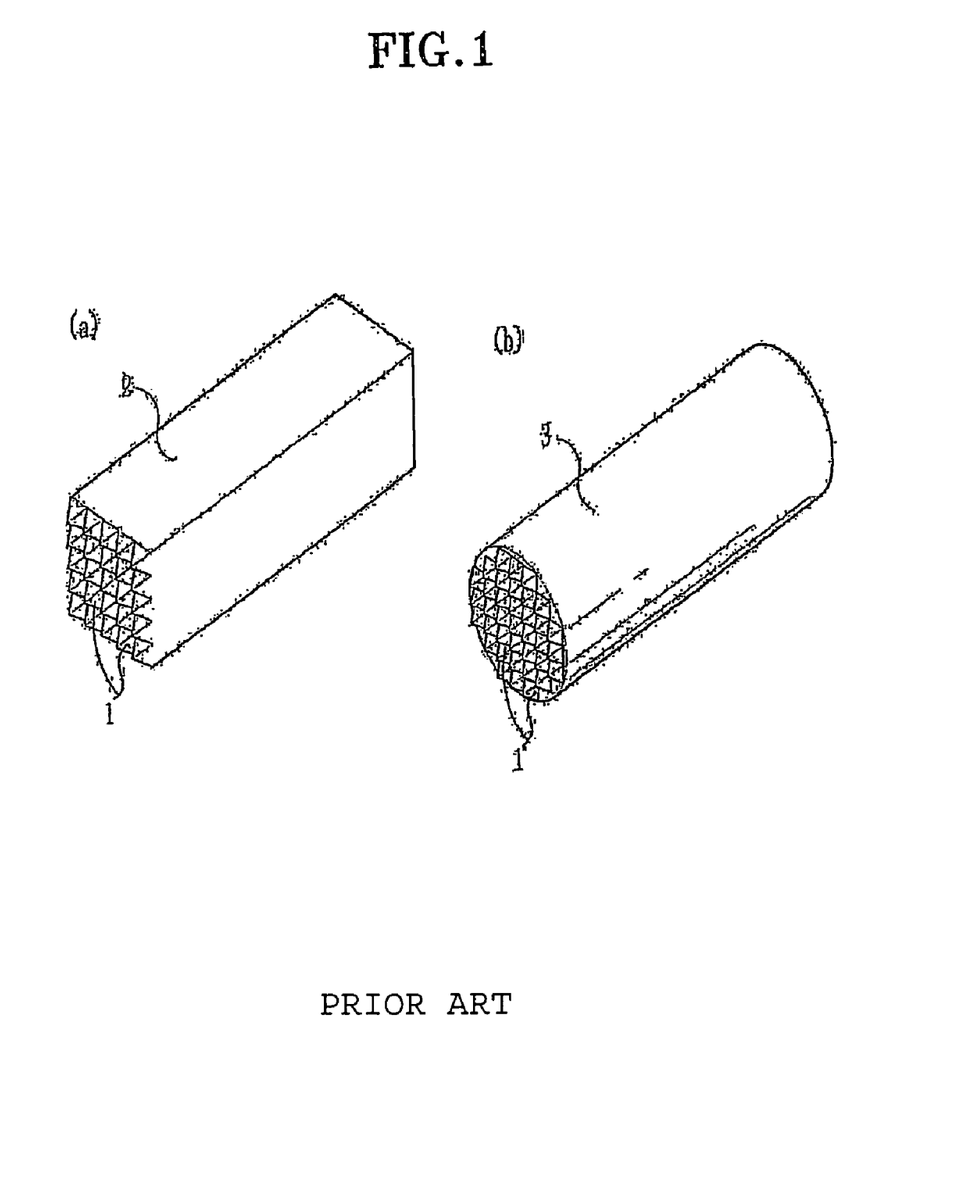
FIG. 1 shows a support beam and a tip part of a conventional vertical-type electric contactor.

As illustrated in FIG. 1($a$), conventional vertical-type electric contactor includes a body 2 having a square-column shape and a plurality of protrusive tips 1 formed on the bottom of the body 2. Each of the tips 1 has a pyramid shape or a truncated pyramid shape, and the tips 1 and the body 2 is a single body. The body 2 and the tips 1 are each made of conductive material such as nickel or nickel alloy. As illustrated in FIG. 1($b$), a cylindrical body 3 may be provided.

Figure 2:
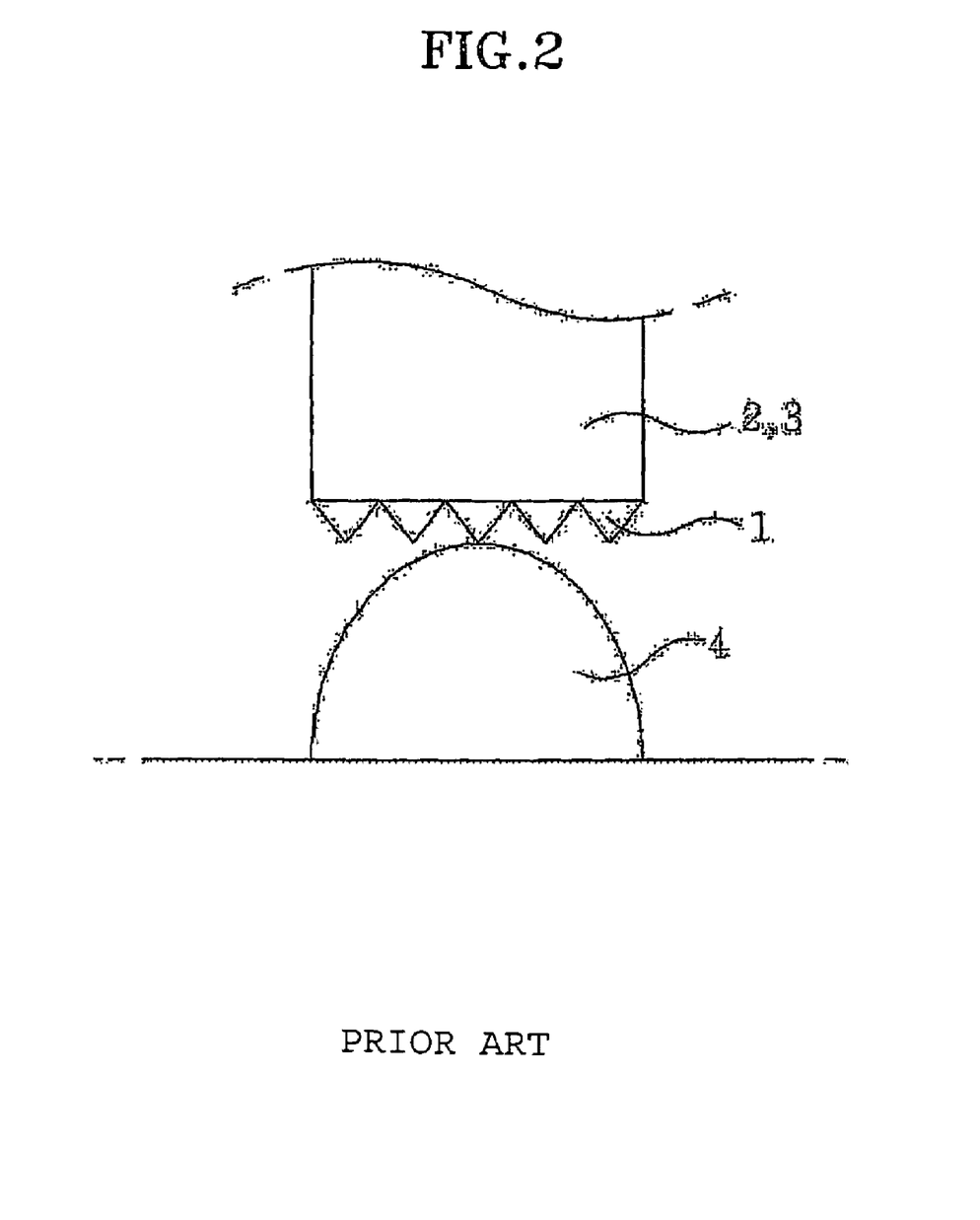
FIG. 2 shows an example where a conventional vertical-type electric contactor is used to test a pad.

FIG. 2 shows the example where such a conventional vertical-type electric contactor is used. Generally, a vertical-type electric contactor is vertically fixed to a probe card by a predetermined physical force, contacting a test portion of a to-be-tested substance such as a ball-shaped pad 4 of a semiconductor device. Thereafter, an electrical signal is applied to the pad 4 to test whether the semiconductor device is normal.

In the event that the semiconductor device is tested by means of the conventional vertical-type electric contactor, the body 2 or 3 is inelastic or fragile. A sufficient overdrive (OID) value may not be obtained with the shape of the body 2 or 3. Moreover, it is difficult to efficiently distribute a reaction force generated at a probe tip 1 when the probe tip 1 contacts the pad 4 to secure a sufficient OID value that a probe card needs.

DISCLOSURE

Technical Problem

Exemplary embodiments of the present invention are directed to a vertical-type electric contactor to effectively distribute a reaction force generated when a tip of the vertical-type electric contactor contacts a pad and to secure a sufficient O/D value and a method of manufacturing the vertical-type electric contactor.

Technical Solution

An exemplary embodiment of the invention provides a vertical-type electric contactor connected to a bump of an electric contactor. The vertical-type electric contactor includes a support beam, vertically bonded with the bump, in which at least two elastic parts are spaced apart from each other; a fixed part disposed at the bottom end of the support beam for fixing the support beam; and a tip part disposed at the bottom end of the fixed part, the tip part and the fixed part being a single body.

An exemplary embodiment of the invention provides a method of manufacturing a vertical-type electric contactor connected to a bump of an electric constituent. The method includes forming a first protective pattern on a sacrificial substrate; performing an etching process, using the first protective pattern as an etch mask, to form an opening on the sacrificial substrate; removing a first protective pattern; forming an additional protective pattern to offer a space; filling the opening and the space with a conductive metal material to form a predetermined-shaped tip part and a predetermined-shaped fixed part, the tip part and the fixed part being a single body; forming a support beam on the fixed part, the support beam having at least two bent elastic part; forming a predetermined-shaped body on the support beam; bonding the body with the bump of the electric constituent; and removing the sacrificial substrate to expose the tip part.

ADVANTAGEOUS EFFECTS

According to the vertical-type electric contactor, at least two elastic parts are provided such that a support beam exerts an elastic force by means of an external force. Thus, a reaction force generated at a tip of the vertical-type electric contactor when the tip contact a pad is effectively distributed to secure a sufficient O/D value that the vertical-type electric contactor needs.

DETAILED DESCRIPTION

Figure 3:
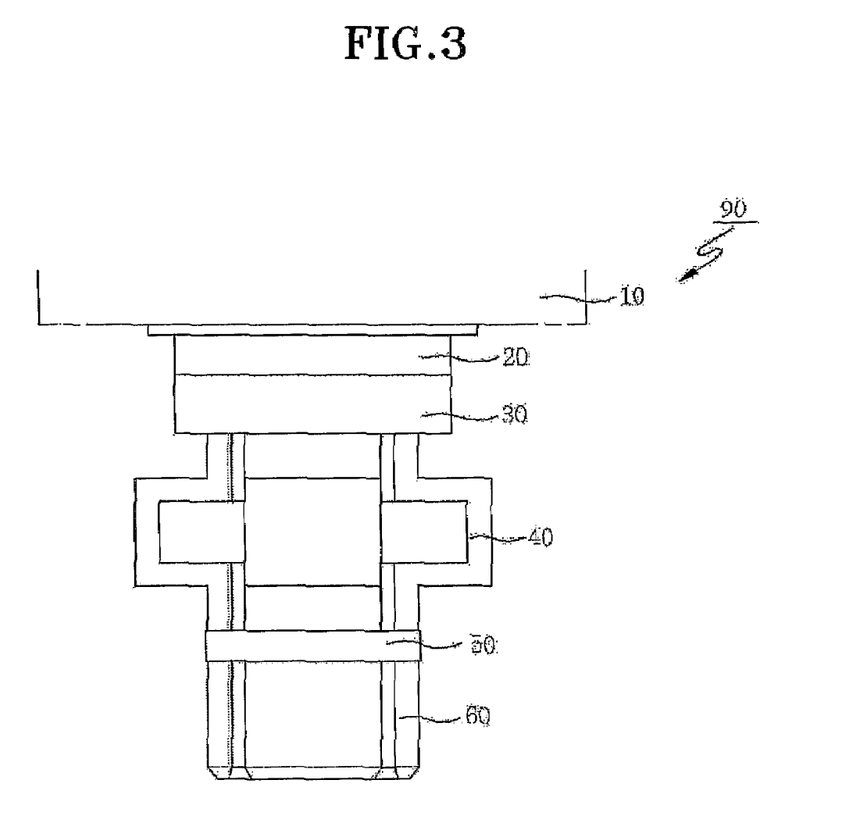
FIG. 3 shows a vertical-type electric contactor according to the present invention.

FIG. 3 shows the configuration of a vertical-type electric contactor 90 according to the present invention. The vertical-type electric contactor 90 includes a body 30, a support beam 40, a fixed part 50, and a tip part 60 that are sequentially coupled with a bump 20 of an electric constituent 10.

The electric constituent 10 includes at least one connection terminal and interconnection for applying electric signals to a to-be-tested electronic element (e.g., flat display panel, semiconductor device, display driving integrated circuit, etc.). A bump 20 has a predetermined shape and is provided on the connection terminal of the electric constituent 10.

The body 30 has a predetermined shape and is coupled with the bottom end of the bump 20 by means of bonding such as flip-chip bonding. For the bonding, the bump 20 and the body 30 have the same shape such as polygonal column (e.g., triangular prism and square column) or cylinder. Alternatively, the bump 20 and the body 30 may have the same shape such as a solid column or a hollow column.

Figure 4:
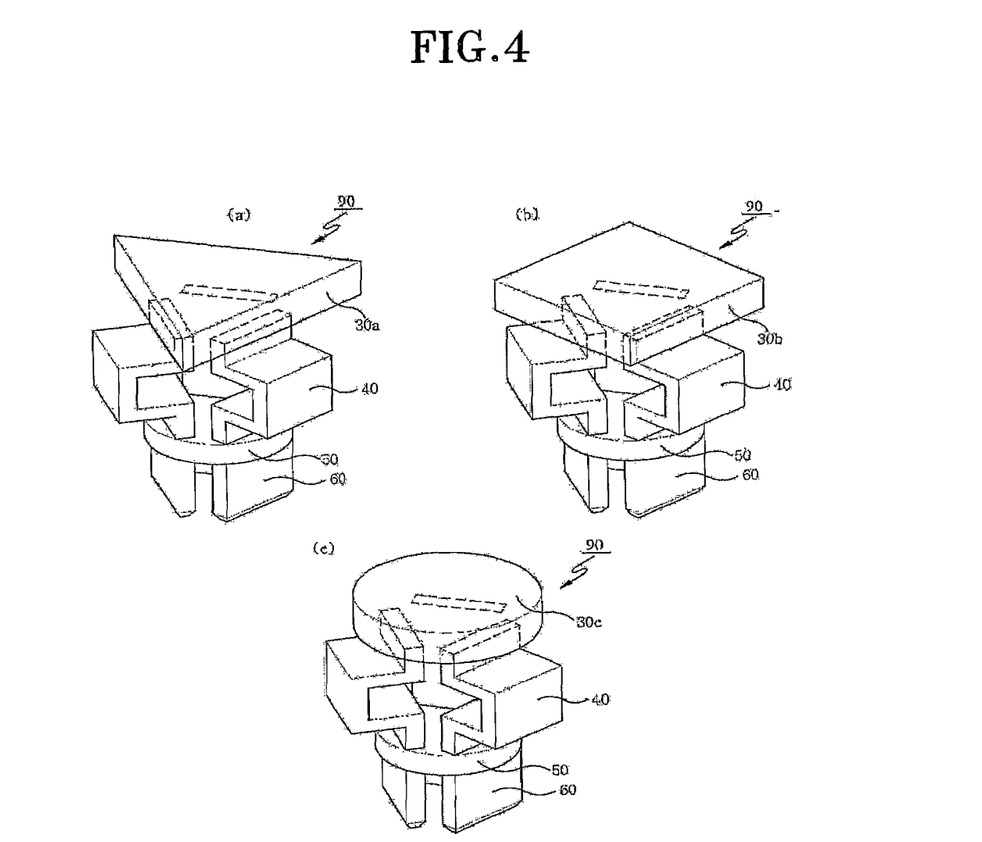
FIG. 4 is a perspective view of vertical-type electric contactors having various shapes.

FIG. 4 shows various shapes of the body 30 shown in FIG. 3. Specifically, FIG. 4(a), FIG. 4(b), and FIG. 4(c) show a triangular-column body 30a, a square-column body 30b, and a cylindrical body 30c, respectively. Nevertheless, a hollow triangular-prism body, a hollow square-column body, and a hollow cylindrical body may be provided.

A support beam 40, which is the most characteristic element of the present invention, is disposed on the bottom end of the respective bodies 30a, 30b, and 30c. The support beam 40 has a plurality of elastic parts 41 that are shrunk when an external force is applied while being expanded when the external force is not applied. The elastic parts 41 are spaced at regular intervals and are arranged in a radial direction. Each of the elastic parts 41 may have a shape of ⊐ or ⟩.

Figure 5:
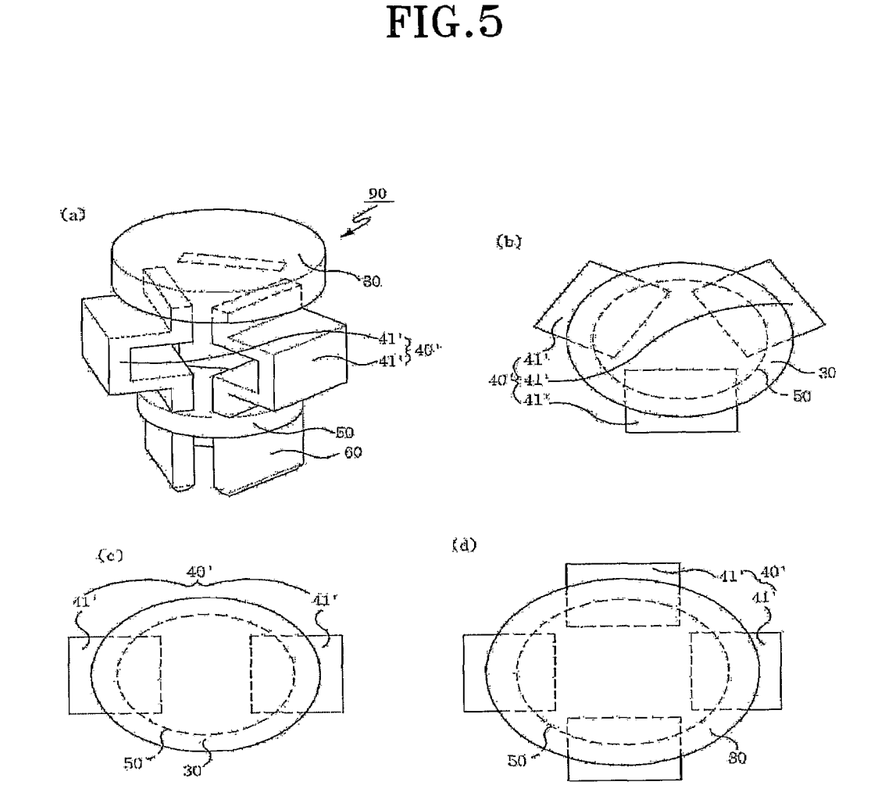
FIG. 5 shows a support beam with a ㄹ-shaped elastic part.

FIG. 5 shows a vertical-type electric contactor including a support beam with ⊐-shaped elastic parts.

Referring to FIG. 5(a), a vertical-type electric contactor 90 includes a support beam 40' with a plurality of ⊐-shaped elastic parts 41'. Hence, the vertical-type electric contactor 90 may exert an elastic action by means of an external force. Preferably, two to four ⊐-shaped elastic parts 41' are provided. If only one elastic part 41' is provided, the vertical-type electric contactor 90 has difficulty in exerting a balanced elastic action. In the meantime, if at least five elastic parts 41' are provided, there may be entered difficulty in fabricating a support beam and impediment to elasticity generation.

FIG. 5(b), FIG. 5(c), and FIG. 5(d) show a support beam 40' with three ⊐-shaped elastic parts 41', a support beam 40' with two ⊐-shaped elastic parts 41', and a support beam 40' with four ⊐-shaped elastic parts 41', respectively. As shown in the figures, two to four elastic parts are provided to generate an appropriate elasticity and overcome a difficulty in fabricating the same.

Figure 6:
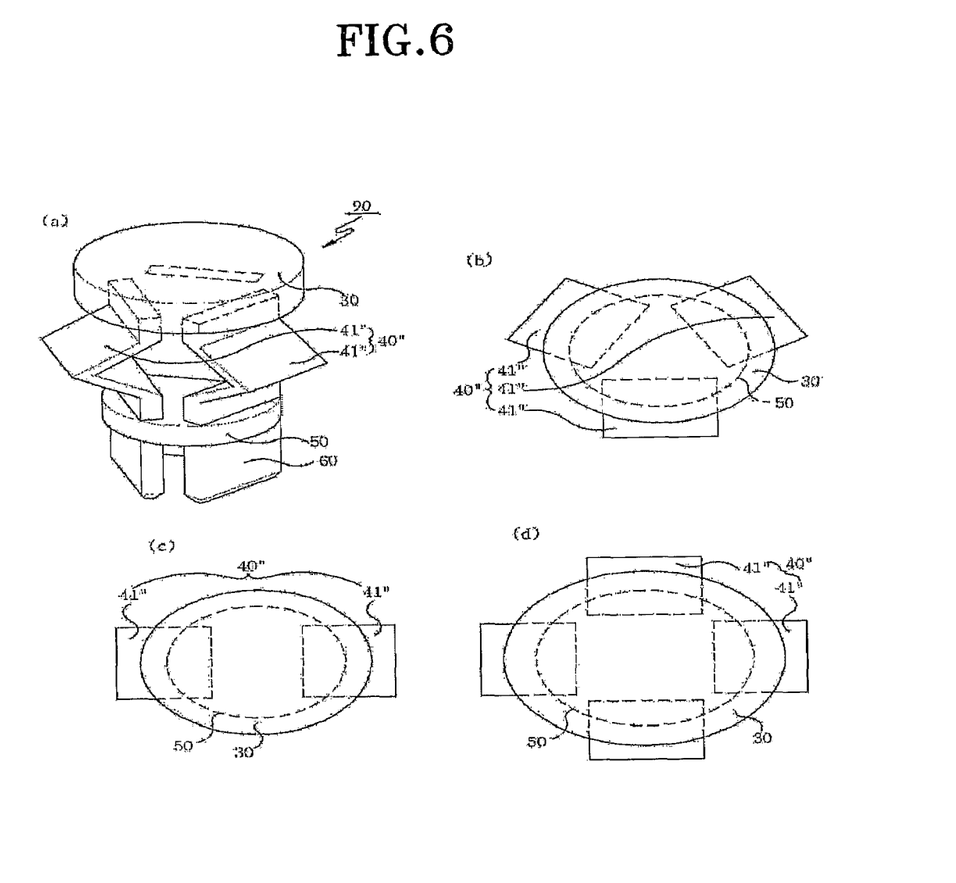
FIG. 6 shows a support beam with a ㄣ-shaped elastic part.

As shown in FIG. 6(a), the vertical-type electric contactor 90 may include a support beam 40" with at least two ⟩-shaped elastic parts 41" which are spaced at regular intervals and arranged in a radial direction.

Similar to the support beam 40' shown in FIG. 5, the support beam 40" has two to four ⟩-shaped elastic parts 41". Specifically, FIG. 6(b), FIG. 6(c), and FIG. 6(d) show a support beam 40" with three elastic parts 41", a support beam 40" with two elastic parts 41", and a support beam 40" with four elastic parts 41", respectively. As shown in the figures, two to four elastic parts are provided to generate an appropriate elasticity and overcome a difficulty in fabricating the same.

Each of the above-described elastic parts 41, 41', and 41" is fixed to an underlying fixed part 50 having a predetermined shape. A tip part 60 including one or more tips is fixed to the bottom end of the fixed part 50.

Figure 7:
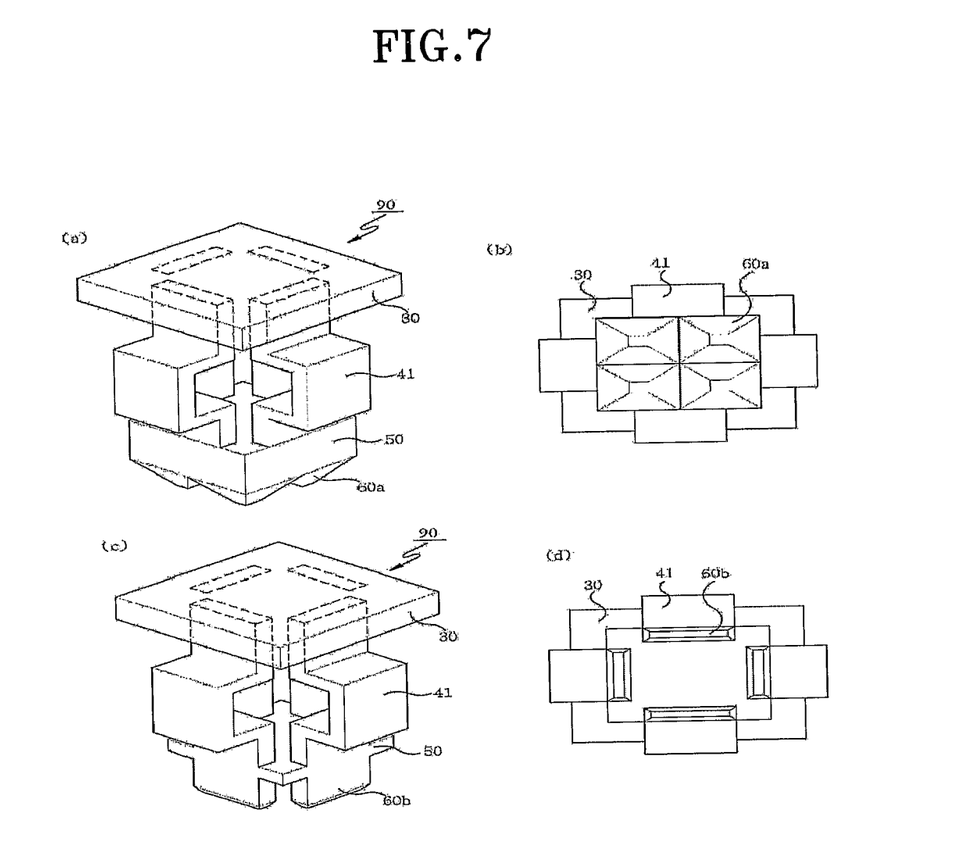
FIG. 7 shows vertical-type electric contactors with tips having various shapes.

The fixed part 50 may have a shape of circle, quadrangle or triangle, as shown in FIG. 6 and FIG. 7. Further, the fixed part 50 may have a shape of a solid column or a hollow column. The tips of the tip part 60 is provided on the bottom end of the fixed part 50 to be spaced at regular intervals and arranged in a radial direction.

The tip part 60 disposed at the bottom end of the fixed part 50 may include pyramid-shaped tips 60a, as shown in FIG. 7(a) and FIG. 7(b). Alternatively, the tip part 60 may include rectangular tips 60b, as shown in FIG. 7(c) and FIG. 7(d).

As described above, the vertical-type electric contactor 90 includes the tip part 60, the fixed part 50, the support beam 40, and the body 30, which are fabricated in the order named. At least two support beams with the elastic parts may be provided to be stacked. In this case, another fixed part may be provided between the elastic parts of the stacked support beams. That is, at least one fixed part and at least one support beam may be stacked between the tip part 60 and the fixed part 50.

Figure 8:
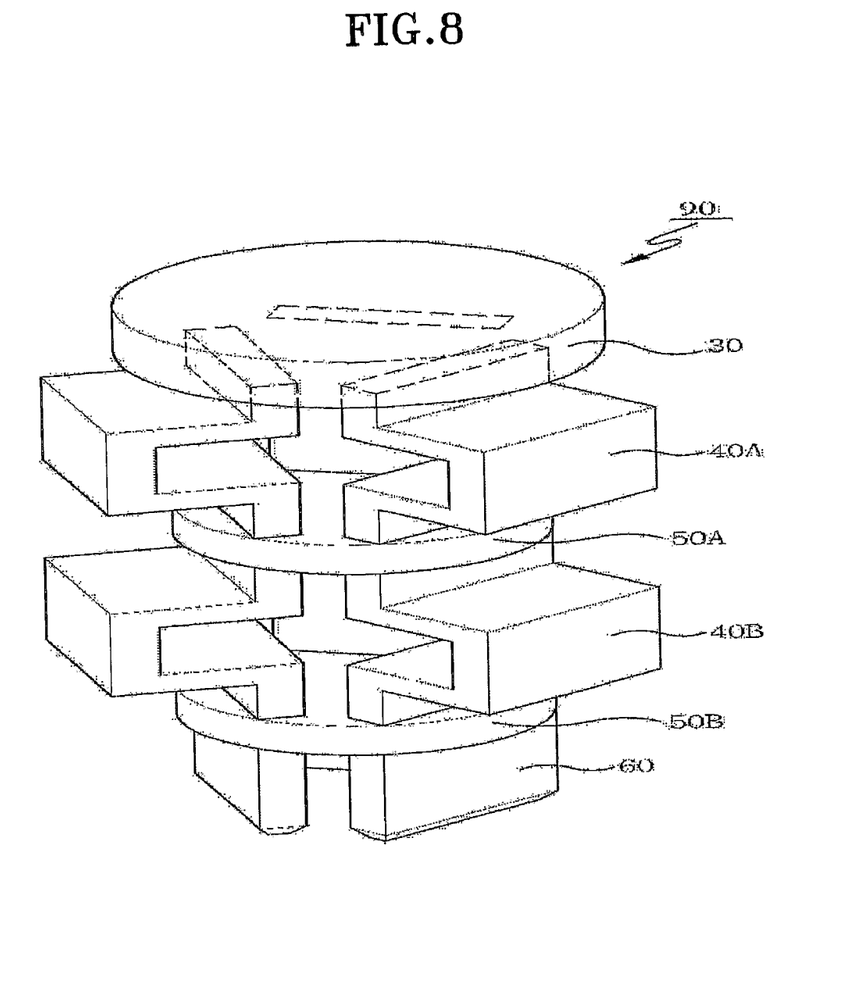
FIG. 8 shows a vertical-type electric contactor in which a support beam and a fixed part is stacked.

FIG. 8 shows a vertical-type electric contactor 90 in which a fixed part and a support beam are stacked one more time. The vertical-type electric contactor 90 may include a tip part 60, a fixed part 50B, a support beam 40B, a fixed part 50A, a support beam 40A, and a body 30, which are stacked in the order named.

Figure 9:
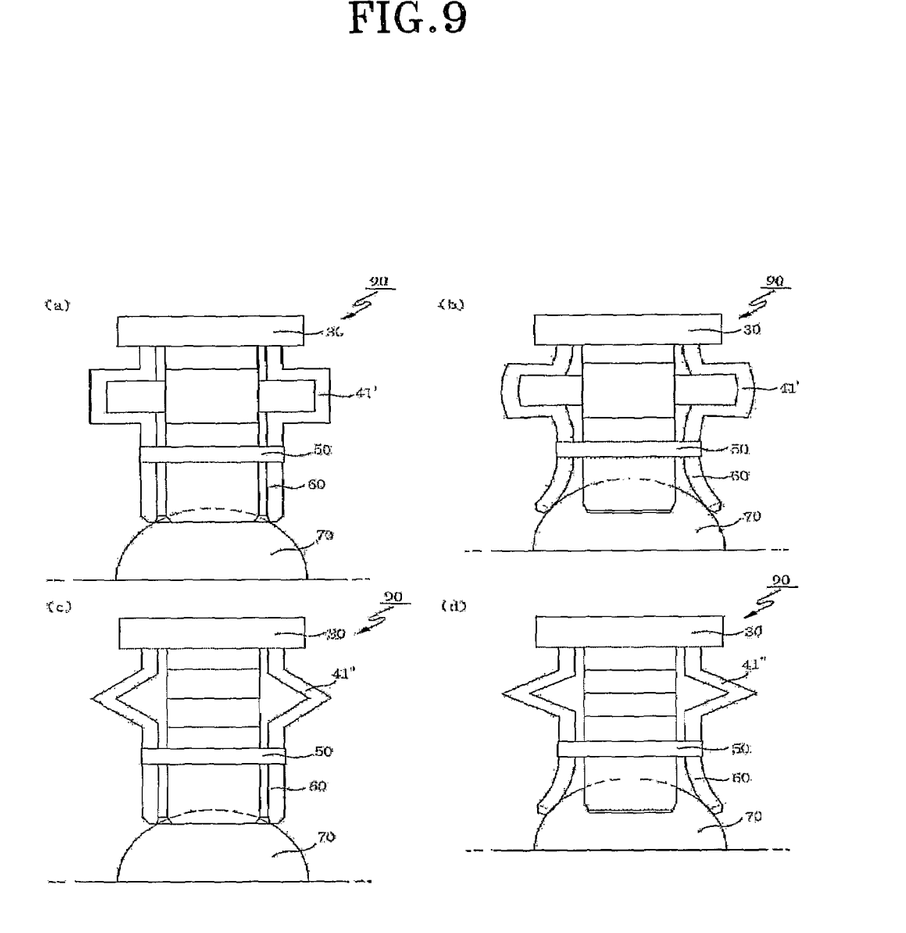
FIG. 9 and FIG. 10 show an embodiment of a pad test using a vertical-type electric contactor according to the present invention.

FIG. 9 shows the procedure of a pad test using a vertical-type electric contactor according to the present invention. Specifically, FIG. 9(a) and FIG. 9(b) show the procedure of a pad test using a vertical-type electric contactor with ⊐-shaped elastic parts 41', and FIG. 9(c) and FIG. 9(d) show the procedure of a pad test using a vertical-type electric contactor with ⟩-shaped elastic parts 41". Further, FIG. 10(e) and FIG. 10(f) show the procedure of a pad test using the vertical-type electric contactor shown in FIG. 8.

Figure 10:
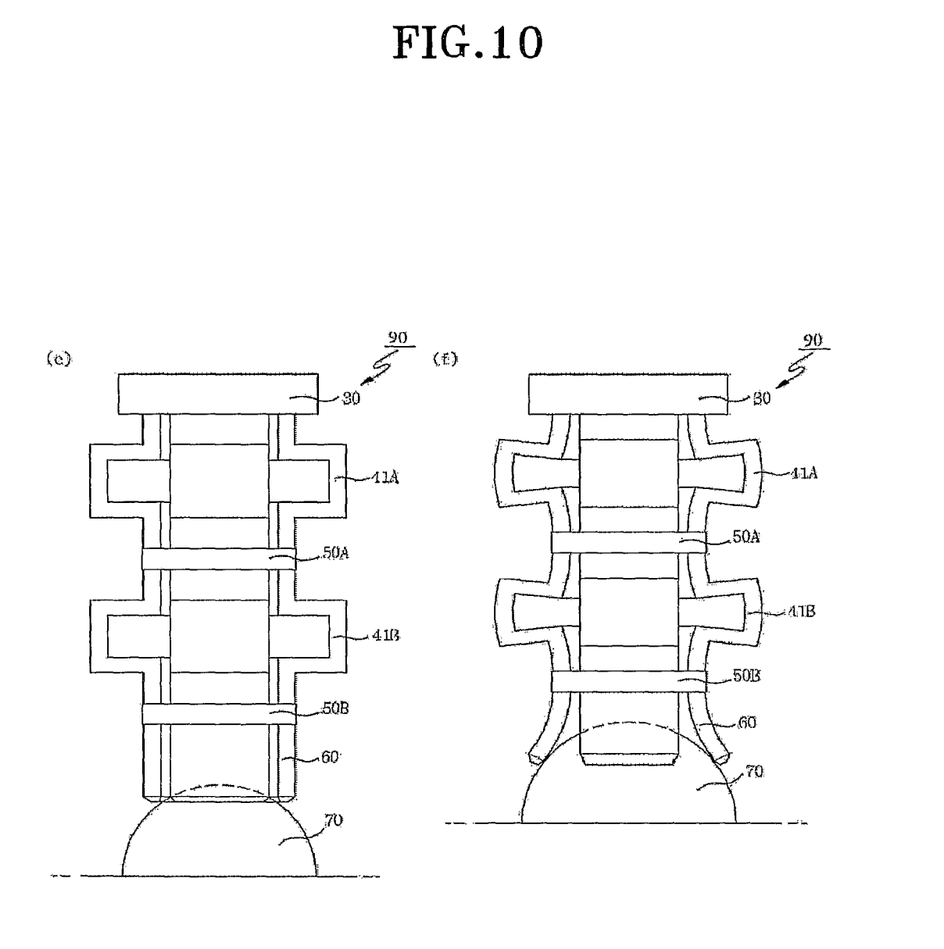

When a force is applied by making a vertical-type electric contactor 90 contact a pad 70 (see FIG. 9(a), FIG. 9(c), and FIG. 10(e)), shapes of elastic parts 41', 41", 41A, and 41B are changed to distribute a reaction force generated at a tip part 60 (see FIG. 9(b), FIG. 9(d), and FIG. 10(f)). If the vertical-type electric contactor 90 is made to be spaced apart from the pad 70 after the test of the pad 70 is completed, the original shapes of the elastic parts 41', 41", 41A, and 41B are restored.

As described in the embodiments, each elastic part has a shape of ⊐ or ⟩ to offer elasticity to a vertical-type electric contactor. However, the shape of the elastic part is not limited thereto and may be modified to offer elasticity to any portion of a vertical-type electric contactor according to the present invention.

A method of manufacturing the above-described vertical-type electric contactor will now be described with reference to FIG. 11 and FIG. 12. The method includes forming a predetermined-shaped tip part and a predetermined-shaped fixed part on a sacrificial substrate, the tip part and the fixed part being a single body; forming a support beam having at least two ⊐-shaped elastic parts on the fixed part; forming a predetermined-shaped body on the support beam; bonding the body with a predetermined-shaped bump formed on an electric constituent, and removing the sacrificial substrate to expose the tip part.

The process for forming the tip part and the fixed part is now described. As described in FIG. 11(a), a first protective pattern 112 is formed on a sacrificial substrate 110, which has a directionality and is made of silicon, to form a predetermined-shaped tip part. The formation of the first protective pattern 112 is done by sequentially performing a photolithography process and an etching process. In the photolithography process, a photoresist is deposited on the sacrificial substrate 110 and the deposited photoresist is exposed and developed.

Figure 11:
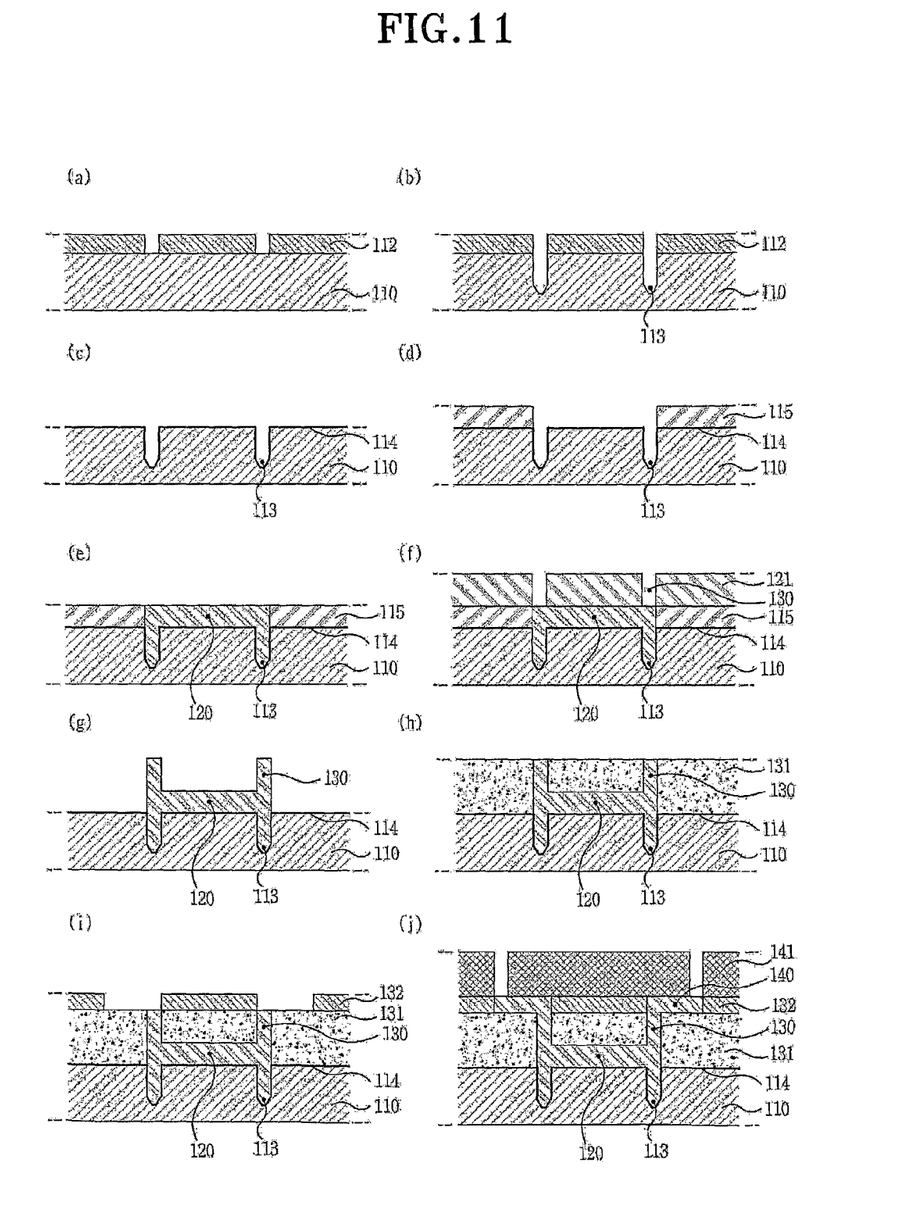
FIG. 11 and FIG. 12 are flow diagrams for explaining a method of manufacturing a vertical-type electric contactor with a ㄹ-shaped elastic part.

As illustrated in FIG. 11(b), using the first protective pattern 112 as an etching mask, a wet etching process and a dry etching process are sequentially conducted to form openings 113 in the sacrificial substrate 110. The opening 113 correspond to a tip part of a predetermined-shaped vertical-type electric contactor. More specifically, the wet etching is conducted to form a shallow trench and the dry etching is conducted to make the trench deeper. The shallow trench corresponds to the end of a tip. That dry etching is a kind of deep trench etching method implemented by reactive ion etching (RIE) that is called the Bosh Process.

After the first protective pattern 112 is removed, a seed layer 114 is formed on the opening 113 and the sacrificial substrate 110 by means of a sputtering process as illustrated in FIG. 11(c). The seed layer 114 is made of copper (Cu) and serves as the seed of a subsequent plating process. A photoresist is deposited thereon to a predetermined thickness. An exposing process and a developing process are performed to form a second protective pattern 115 having a pattern of a fixed part, as illustrated in FIG. 11(d).

As illustrated in FIG. 11(e), a conductive metal material fills the opening 113 and a space, exposed by the second protective pattern 115, where a seed layer 114 is formed. A planarization process, such as chemical mechanical polishing (CMP), etchback, and grinding, is performed to form a predetermined-shaped tip part and a predetermined-shaped fixed part a single body. The formation of the tip part and the fixed part may be done by means of one selected from the group consisting of plating, chemical vapor deposition (CVD), and physical vapor deposition (PVD).

A support beam should be formed following the formation of the tip part and the fixed part. As described above, the support beam includes at least two elastic parts. Preferably, the number of the elastic parts is two to four.

The formation of the support beam is now described below.

As illustrated in FIG. 11(f), a second protective pattern 121 is formed on the fixed part and the second protective pattern 115. A conductive metal material fills a space offered by the third protective pattern 121 to form a first vertical part 130 that is a portion of each elastic part. Following the formation of the first vertical part 130, the second protective pattern 115 and the third protective pattern 121 are removed by means of a wet etching using a chemical such as sodium hydroxide, as illustrated in FIG. 11(g).

As illustrated in FIG. 11(h), a first support layer 131 is formed at the space where the second protective pattern 115 and the third protective 121 pattern are removed. The first support layer 131 is to serve as a seed layer for forming a first horizontal part 140 in a subsequent process. The formation of the first support layer 131 may be done by means of one selected from the group consisting of plating, CVD, and PVD. Even in this case, a planarization process, such as CMP, etchback, and grinding, is also performed to finally form a first support layer 131. The first support layer 131 may be made of copper (Cu).

As illustrated in FIG. 11(i), a fourth protective pattern 132 is formed on the first support layer 131 to form a space defining a first horizontal part 140. A conductive metal material fills the space offered by the fourth protective pattern 132 to form a first horizontal part 140 illustrated in FIG. 11(j).

As illustrated in FIG. 11(j), a fifth protective pattern 141 is formed on the fourth protective pattern 132 and the first horizontal part 140 to offer a space for forming a second vertical part 150 in a subsequent process. A conductive metal material fills the space offered by the fifth protective pattern 141 to form a second vertical part 150. Following the formation of the second vertical part 150, the fourth protective pattern 132 and the fifth protective pattern 141 are removed by means of a wet etching using a chemical such as sodium hydroxide.

Figure 12:
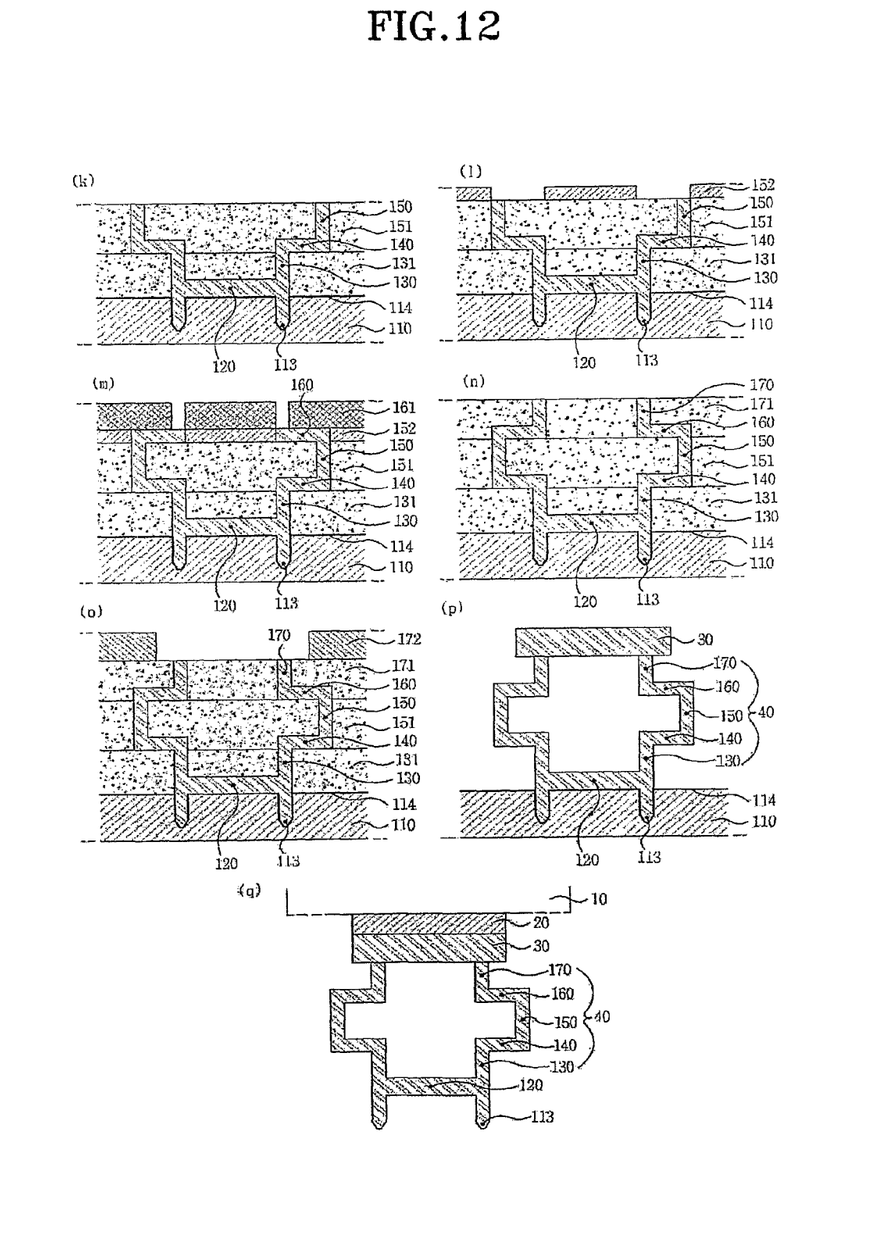

As illustrated in FIG. 12(k), a second support layer 151 is formed at the space where the fourth protective pattern 132 and the fifth protective pattern 141 are removed. The second support layer 151 is to serve as a seed layer for forming a second horizontal part 160 in a subsequent process. The formation of the first support layer 151 may be done by means of one selected from the group consisting of plating, CVD, and PVD. Even in this case, a planarization process, such as CMP, etchback, and grinding, is also performed to finally form a second support layer 151. The second support layer 151 may be made of copper (Cu).

As illustrated in FIG. 12(l), a sixth protective pattern 152 is formed on the second support layer 151 to offer a space defining a second horizontal part 160. A conductive metal material fills the space offered by the sixth protective pattern 152 to form a second horizontal part 160 illustrated in FIG. 12(m).

Following the formation of the second horizontal part 160, a seventh protective pattern 161 is formed on the sixth protective pattern 152 and the second horizontal pattern 160 to offer a space for forming a third vertical part 170 in a subsequent process. A conductive metal material fills the space offered by the seventh protective pattern 161 to form a third vertical part 170 illustrated in FIG. 12(n).

By means of the above process, a support beam is formed. The support beam includes two to four elastic parts. Afterwards, a process is performed to form a body at the top end of the support beam, which is now described below.

Following the formation of the third vertical part 170, the sixth protective pattern 152 and the seventh protective pattern 161 are removed by means of a wet etching using a chemical such as sodium hydroxide. As illustrated in FIG. 12(n), a third support layer 171 is formed on the space where the sixth protective pattern 152 and the seventh protective pattern 161 are removed. The third support layer 171 is to serve as a seed layer for forming a body (30 of FIG. 12(p)) in a subsequent process. The third support layer 170 is a metal layer, which may be formed by means of one selected from the group consisting of plating, CVD, and PVD. Even in this case, a planarization process, such as CMP, etchback, and grinding, is also performed to finally form a third support layer 171. The third support layer 151 may be made of copper (Cu).

As illustrated in FIG. 12(o), an eighth protective pattern 172 is formed on the third support layer 171 to offer a space defining a body (30 of FIG. 12(p)). A conductive metal material fills the space offered by the eighth protective pattern 172 to form a body 30 illustrated in FIG. 12(p).

As illustrated in FIG. 12(p), the eighth protective pattern 172 is removed by means of a wet etching using a chemical such as sodium peroxide. The first, second, and third support layers 131, 151, and 171 are removed by means of a wet etching using a mixed chemical of acetic acid ($CH_3COOH$), hydrogen peroxide, and deionized water (DI water) to complete a support 40 and a body 30.

As illustrated in FIG. 12(q), the body 30 illustrated in FIG. 12(p) is bonded with a bump 20 coupled to an electric constituent 10. Finally, the sacrificial substrate 110 is removed by means of a wet etching using a mixed chemical of potassium hydroxide (KOH) and DI water. As a result, a tip part is opened to manufacture a vertical-type electric contactor having a predetermined shape.

While a vertical-type electric contactor with ㄱ-shaped elastic parts has been described in the foregoing embodiment, other vertical-type electric contactors with different-shaped elastic parts may be fabricated by means of the same (or similar) method as described above.

INDUSTRIAL APPLICABILITY

According to the above-described vertical-type electric contactor, a reaction force generated at a tip part is effectively distributed to test electric devices without damage of the vertical-type electric contactor.

The invention claimed is:

1. A vertical-type electric contactor connected to a bump of an electric contactor, comprising:
   a support beam, vertically bonded with the bump, in which the support beam comprises at least two separate elastic parts that are spaced apart from each other;
   a fixed part disposed at the bottom end of the support beam for fixing the support beam;
   a tip part disposed at the bottom end of the fixed part, the tip part and the fixed part being a single body; and
   a body disposed between the bump and the support beam and having the same shape as the bump.

2. The vertical-type electric contactor of claim 1, wherein the body has a shape of one selected from the group consisting of a hollow square column, a solid square column, a hollow triangular prism, a solid triangular prism, a hollow cylinder, and a solid cylinder.

3. The vertical-type electric contactor of claim 1, wherein each of the elastic parts is a ߆-shaped part.

4. The vertical-type electric contactor of claim 1, wherein each of the elastic part is a ߈-shaped part.

5. The vertical-type electric contactor of claim 3, wherein the elastic parts are spaced at regular intervals and arranged in a radial direction.

6. The vertical-type electric contactor of claim 1, comprising a plurality of support beams stacked.

7. The vertical-type electric contactor of claim 6, further comprising:
   a fixed part disposed between the support beams for fixing the support beams.

8. The vertical-type electric contactor of claim 1, wherein the tip part comprises a plurality of tips disposed below the fixed part to be arranged in a radial direction and spaced apart from one another.

9. A vertical-type electric contactor connected to a bump of an electric contactor, comprising:
   a plurality of support beams stacked, one of the plurality of support beams being vertically bonded with the bump, in which each of the plurality of support beams comprises at least two elastic parts that are spaced apart from each other;
   a fixed part disposed at the bottom end of one of the plurality of support beams that is not bonded with the bump for fixing the plurality of support beams; and
   a tip part disposed at the bottom end of the fixed part, the tip part and the fixed part being a single body.

10. The vertical-type electric contactor of claim 9, further comprising:
    a fixed part disposed between the support beams for fixing the support beams.

11. A vertical-type electric contactor connected to a bump of an electric contactor, comprising:
    a support beam, vertically bonded with the bump, in which the support beam comprises at least two separate elastic parts that are spaced apart from each other;
    a fixed part disposed at the bottom end of the support beam for fixing the support beam; and
    a tip part disposed at the bottom end of the fixed part, the tip part and the fixed part being a single body wherein the tip part comprises a plurality of tips disposed below the fixed part to be arranged in a radial direction and spaced apart from one another.

* * * * *